(12) United States Patent
Fricke et al.

(10) Patent No.: US 6,707,087 B2
(45) Date of Patent: Mar. 16, 2004

(54) STRUCTURE OF CHALCOGENIDE MEMORY ELEMENT

(75) Inventors: Peter Fricke, Corvallis, OR (US); Andrew Koll, Albany, OR (US); Andrew L. Van Brocklin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 45 days.

(21) Appl. No.: 10/177,239

(22) Filed: Jun. 21, 2002

(65) Prior Publication Data

US 2003/0235073 A1 Dec. 25, 2003

(51) Int. Cl.$^7$ ............................................. H01L 27/108
(52) U.S. Cl. ..................... 257/296; 257/288; 257/798; 438/257; 438/800
(58) Field of Search ................ 257/296, 288, 257/298, 798; 438/800, 96, 257

(56) References Cited

U.S. PATENT DOCUMENTS

| | | |
|---|---|---|
| 4,792,841 A | 12/1988 | Nagasawa et al. |
| 5,311,465 A | 5/1994 | Mori et al. |
| 5,406,509 A | 4/1995 | Ovshinsky et al. |
| 5,625,220 A | 4/1997 | Liu et al. |
| 5,714,768 A | 2/1998 | Ovshinsky et al. |
| 5,734,605 A | 3/1998 | Zhu et al. |
| 5,835,396 A | 11/1998 | Zhang |
| 5,926,415 A | 7/1999 | Shin |
| 5,978,257 A | 11/1999 | Zhu et al. |
| 6,002,607 A | 12/1999 | Dvir |
| 6,031,287 A | 2/2000 | Harshfield |
| 6,034,882 A | 3/2000 | Johnson et al. |
| 6,097,625 A | 8/2000 | Scheuerlein |
| 6,185,121 B1 | 2/2001 | O'Neill |
| 6,185,122 B1 | 2/2001 | Johnson et al. |
| 6,236,590 B1 | 5/2001 | Bhattacharyya et al. |
| 6,284,643 B1 | 9/2001 | Reinberg |
| 6,339,544 B1 | 1/2002 | Chiang et al. |
| 6,404,674 B1 | 6/2002 | Anthony et al. |
| 6,501,111 B1 | 12/2002 | Lowrey |
| 6,531,373 B2 * | 3/2003 | Gill et al. .................. 438/400 |
| 2003/0211732 A1 * | 11/2003 | Chiang ...................... 438/652 |

* cited by examiner

*Primary Examiner*—Richard Elms
*Assistant Examiner*—Brad Smith (57) ABSTRACT

A memory structure that includes a control element electrode, a heater electrode, a memory element electrode, a chalcogenide based memory element disposed between the memory element electrode and the heater electrode, and a control element disposed between the heater electrode and the control element electrode.

35 Claims, 6 Drawing Sheets

STRUCTURE OF CHALCOGENIDE MEMORY ELEMENT

BACKGROUND OF THE DISCLOSURE

As computer and other electrical equipment continue to drop in price, the manufacturers of storage devices, such as memory devices and hard drives, are forced to lower the cost of their components. At the same time, computer, video game, television and other electrical device markets are requiring increasingly larger amounts of memory to store images, photographs, videos, movies, music and other storage intensive data. Thus, besides reducing cost, manufacturers of storage devices must also increase the storage density of their devices. This trend of increasing memory storage density while reducing cost required to create the storage has been on-going for many years, and even optical storage such as CD-ROM, CD-R, CD-R/W, DVD, and DVD-R variants are being challenged by device size limitations and cost. There is accordingly a need for economical, high capacity memory structures.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION OF THE DISCLOSURE

Figure 1:
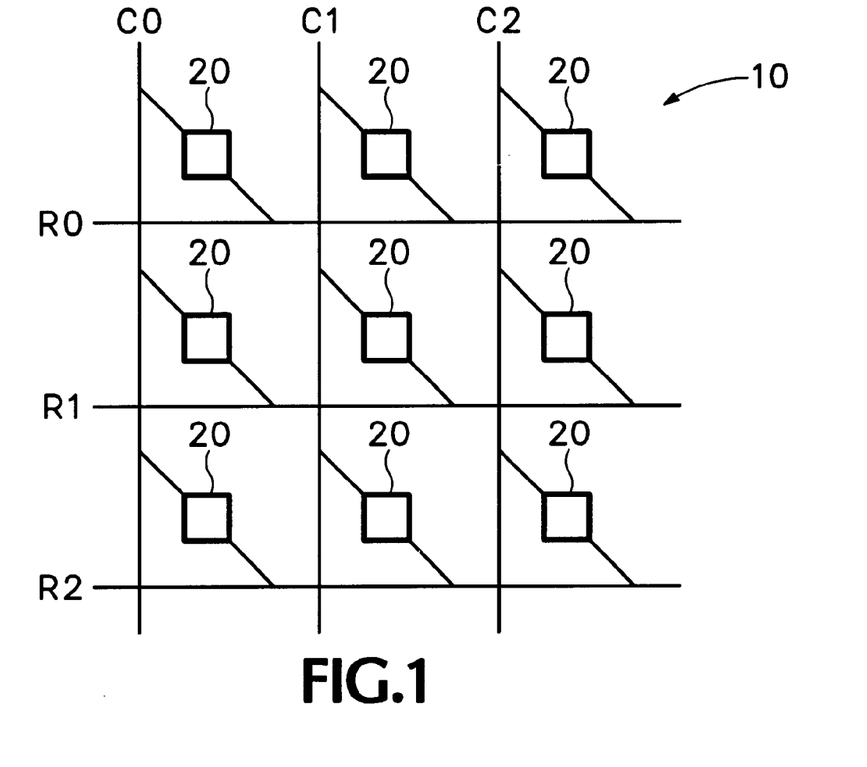
FIG. 1 is a schematic diagram of an embodiment of a cross-point memory array in which the disclosed memory cell structures can be utilized.

FIG. 1 is a simplified schematic diagram of an embodiment of a cross-point memory array 10 in which the disclosed memory cell structures can be utilized. The memory arrangement 10 includes row selection conductor lines R0, R1, R2 and column selection conductor lines C0, C1, C2. A memory cell 20 is connected between each row selection conductor line R0, R1, R2 and each column selection conductor line C0, C1, C2. It should be appreciated that the row selection conductor lines and the column selection conductor lines are referred to by "row" and "column" terminology for convenience, and that in actual implementations the memory cells 20 do not necessarily have to be physically arranged in rows and columns. Each memory cell is basically uniquely accessed or selected by a first selection line and a second selection line that can be oriented in different ways. Also, the column lines do not have to be orthogonal to the row lines, but are illustrated in that manner for ease of understanding.

Figure 2:
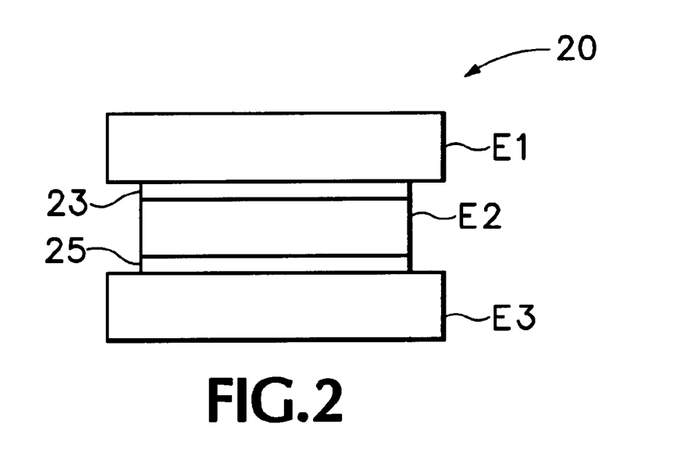
FIG. 2 is a schematic block diagram of an embodiment of a memory cell that includes a chalcogenide based phase change semiconductor memory storage element and a control element for the memory storage element.

FIG. 2 is a simplified electrical block diagram of an embodiment of the memory cell 20 which includes a memory storage element 23 that is electrically connected to a control element 25 by an electrode E2. The memory storage element 23 and the control element 25 are serially connected between an electrode E1 and an electrode E3. The electrodes E1–E3 comprise conductive elements such as conductors, conductive regions or other conductive features, and it should be appreciated that each of the electrodes can comprise one or more electrically conductive elements.

The memory storage element 23 more particularly is a chalcogenide based read/write or write/erase/write phase change semiconductor memory storage element formed for example of a chalcogenide alloy such as germanium telluride (GeTe) which can be reversibly changed from a semiconducting (amorphous) state to a conducting metallic (crystalline) state by heating and cooling it at a proper rate. In particular, heating the chalcogenide based memory storage element 23 causes it to be in the semiconducting or high resistance state. Relatively slow cooling will cause the chalcogenide based memory storage element to change to a metallic state, while relatively fast cooling will cause the chalcogenide based memory storage element 23 to remain in the semiconducting state. Other chalcogenide alloys that can be employed include GaSb, InSb, InSe, Sb2Te3, Ge2Sb2Te5, InSbTe, SnSb2Te4, InSbGe, AgInSbTe, (GeSn)SbTe, GeSb(SeTe), Te81Ge15Sb2S2 and GeSbTe.

The electrode E2 more particularly is a heater electrode for selectively heating the chalcogenide based memory storage element 23 to place it in the semiconducting state, and controlling the cooling of the chalcogenide based memory storage element 23. By way of illustrative examples, the heater electrode can include tungsten or titanium.

The control element 25 can be a tunnel junction device or PN, PIN or Schottky diodes. Other diodes that can be used include Zener diodes, avalanche diodes, tunnel diodes, and a four layer diode such as a silicon controlled rectifier. Also, the control element 25 can be a junction field effect or bipolar transistor. The control element 25 is sized sufficiently to carry an adequate current such that the state of the storage element 23 can be changed. When the control element is a diode, it can be formed using doped polysilicon, amorphous silicon, or microcrystalline silicon.

For ease of discussion, the disclosed memory structures are described, by way of illustrative examples, as employing a tunnel junction device as the control element, and it should be appreciated that the control element can be implemented as described above.

Also by way of illustrative examples, the disclosed memory structures are depicted as integrated circuits that include interlayer dielectric (ILD) such as silicon dioxide, silicon nitride, or TEOS (tetraethylorthosilicate) that provide support and isolation between various structures of an integrated circuit. The ILD, can be deposited using several different technologies such as chemical vapor deposition (CVD), atmospheric pressure CVD, low pressure CVD, plasma enhanced CVD, physical vapor deposition (PVD), and sputtering. For convenience, regions and layers of such dielectric are identified in the drawings by the reference designation ILD.

Figure 3:
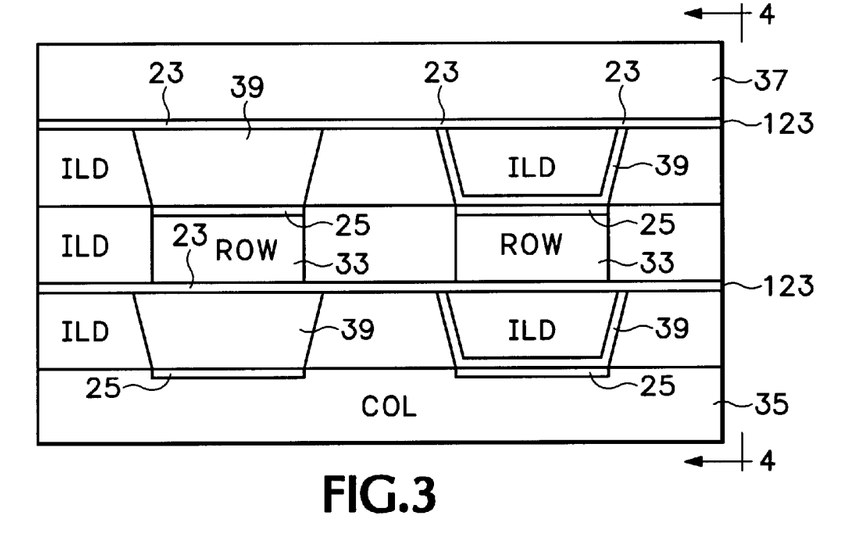
FIGS. 3 and 4 are sectional views that schematically depict embodiments of a memory structure that includes a chalcogenide based phase change semiconductor memory storage element.
Figure 4:
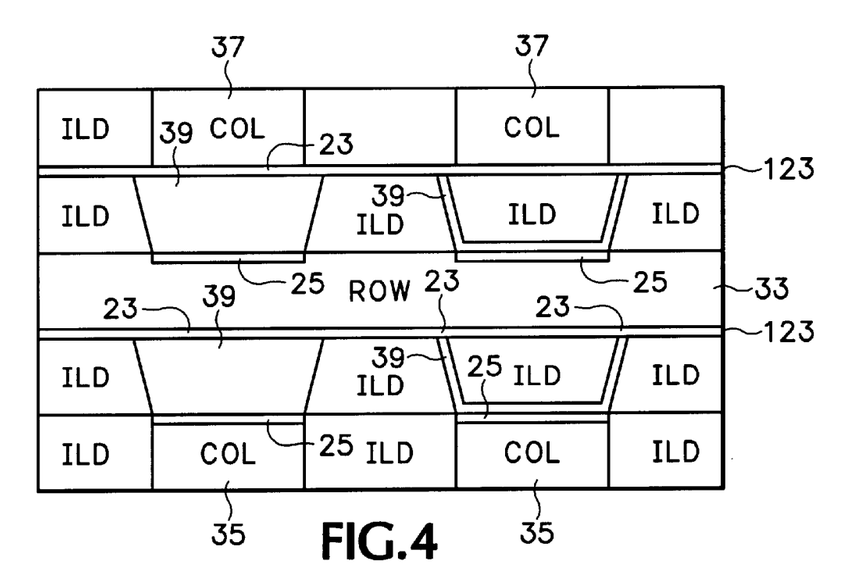

FIGS. 3 and 4 schematically depict embodiments of a memory structure that includes a plurality of memory cells each including a chalcogenide based memory storage element 23 disposed between a heater electrode 39 and a conductor 33 or 37 that is vertically adjacent a top surface of the heater electrode. The chalcogenide based memory storage element 23 can be a portion of an unpatterned chalcogenide layer 123 or can be a suitably patterned chalcogenide region. As schematically depicted, the heater electrode 39 can be a heater via fill or a heater tubwell.

Each memory cell further includes a control element 25 disposed between a lower surface of the heater electrode 39 and a conductor 33 or 35 that is vertically adjacent the lower surface of the heater electrode 39. The control element 25 can be formed of an oxide of the conductor 33 or 35 that is vertically adjacent the lower surface of the heater electrode 39. Alternatively, the control element 25 can be formed of an oxide that is different from an oxide of the conductor 33 or 35. The control element 25 can also be a portion of an unpatterned oxide layer that can be a deposited oxide layer or a completely oxidized deposited metal layer, for example.

The memory cells of FIGS. 3 and 4 can be implemented in stacked layers for example wherein a conductor 33 that is vertically adjacent a top surface of a heater electrode 39 is vertically adjacent the lower surface of a heater electrode that is in an adjacent layer.

By way of illustrative example, the conductor 33 can be a memory row selection line while the conductors 35, 37 can be memory column selection lines in a cross-point memory structure.

Figure 5:
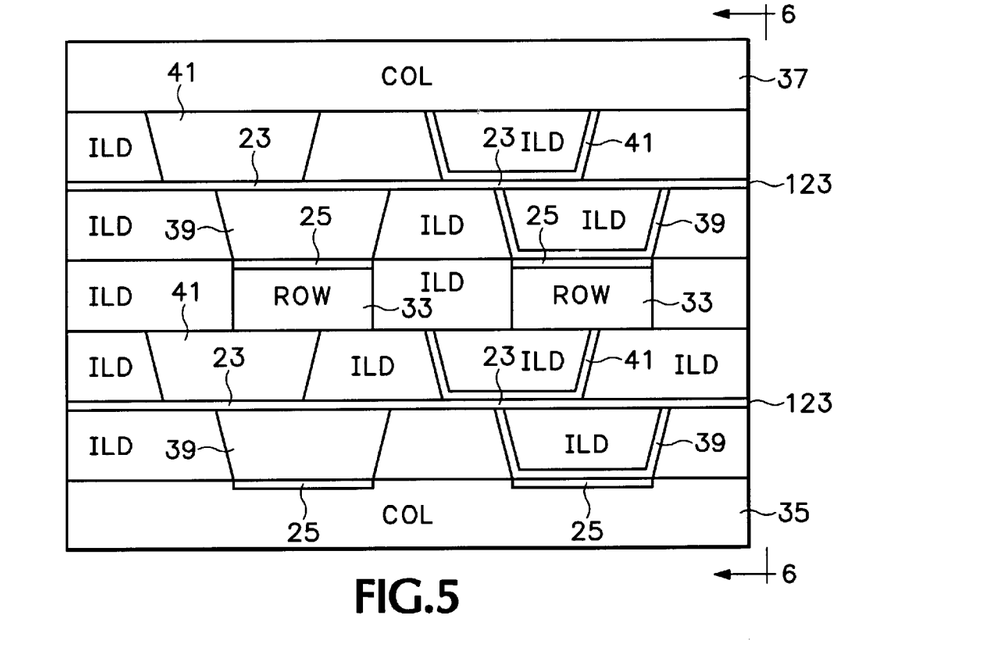
FIGS. 5 and 6 are sectional views that schematically depict further embodiments of a memory structure that includes a chalcogenide based phase change semiconductor memory storage element.
Figure 6:
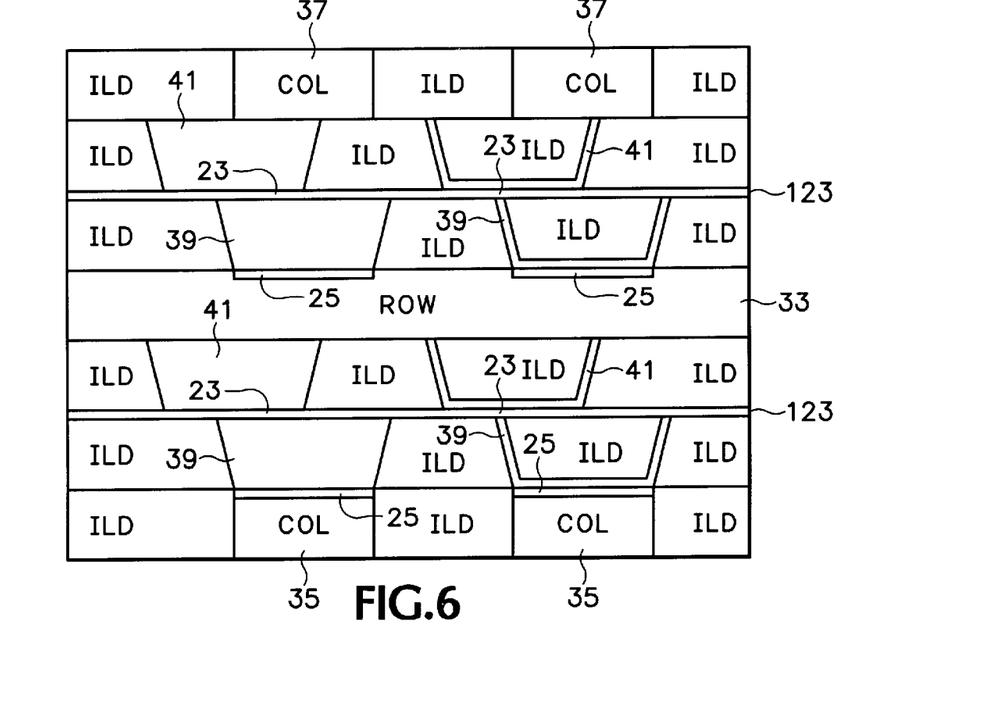

FIGS. 5 and 6 schematically depict embodiments of a memory structure that includes a plurality of memory cells each including a chalcogenide based memory storage element 23 disposed between a heater electrode 39 and a thermal conduction reducing conductor 41 that is vertically adjacent a top surface of the heater electrode. The chalcogenide based memory storage element 23 can be a portion of an unpatterned chalcogenide layer 123 or can be an suitably patterned chalcogenide region. A conductor 33 or 37 can be disposed vertically adjacent and in contact with the thermal conduction reducing conductor 41. The thermal conduction reducing conductor 41 reduces thermal conduction from the chalcogenide memory storage element 23 and the conductor 33 or 37, and as schematically depicted can be a conductive via fill or a conductive tubwell, for example. By way of illustrative example the thermal conduction reducing conductor 41 can include titanium, tungsten, tantalum and/or alloys thereof, for example. As schematically depicted in FIGS. 5 and 6, the heater electrode 39 can be a heater via fill or a heater tubwell.

Each memory cell further includes a control element 25 disposed between a lower surface of the heater electrode 39 and a conductor 33 or 35 that is vertically adjacent the lower surface of the heater electrode 39. The control element 25 can be formed of an oxide of the conductor 33 or 35 that is vertically adjacent the lower surface of the heater electrode 39. Alternatively, the control element 25 can be formed of an oxide that is different from an oxide of the conductor 33 or 35. The control element 25 can also be a portion of an unpatterned oxide layer that can be a deposited oxide layer or a completely oxidized deposited metal layer, for example.

The memory cells of FIGS. 5 and 6 can be implemented in stacked layers for example wherein a conductor 33 that is vertically adjacent a top surface of a thermal conduction reducing conductor 41 is vertically adjacent the lower surface of a heater electrode that is in an adjacent layer.

By way of illustrative example, the conductor 33 can be a memory row selection line while the conductors 35, 37 can be memory column selection lines in a cross-point memory structure.

Figure 7:
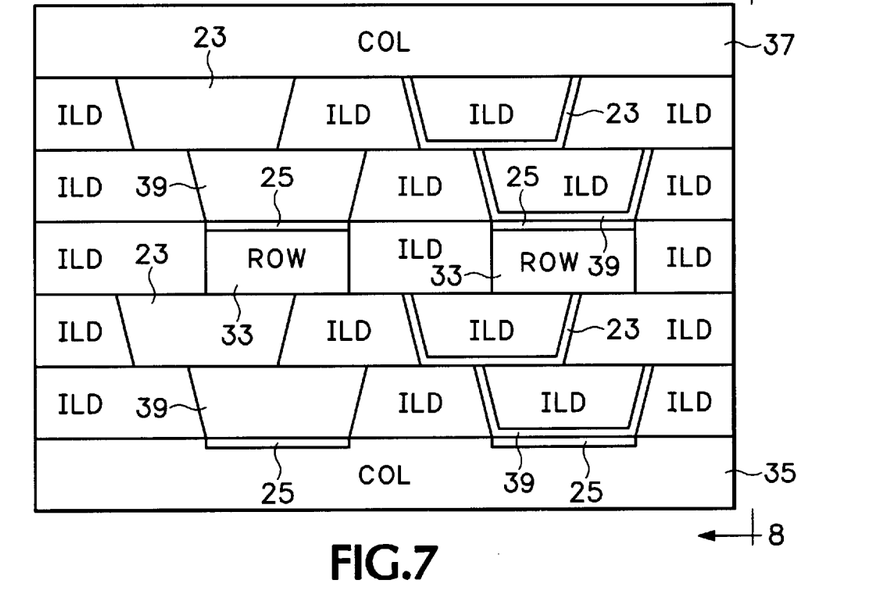
FIGS. 7 and 8 are sectional views that schematically depict still further embodiments of a memory structure that includes a chalcogenide based-phase change semiconductor memory storage element.
Figure 8:
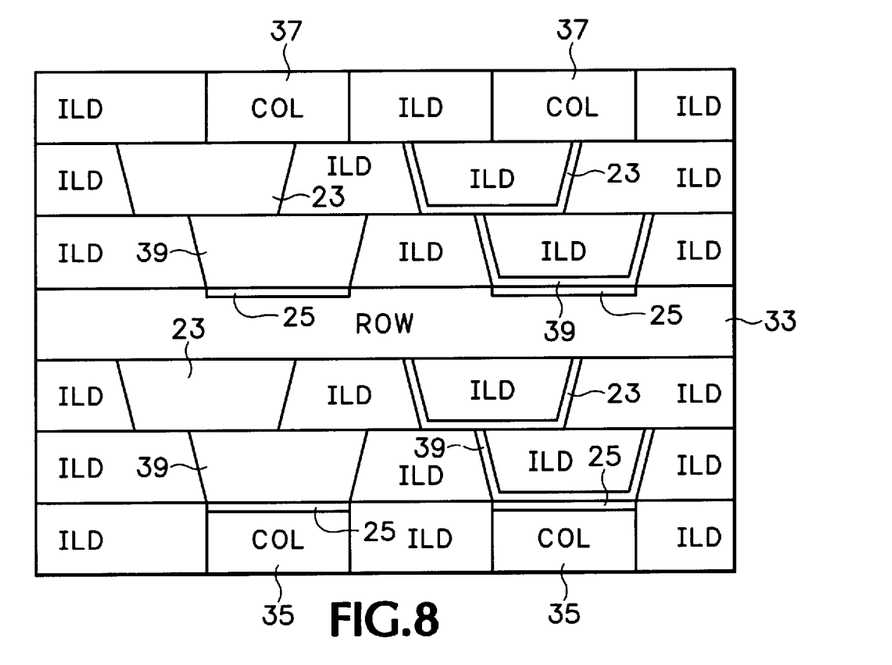

FIGS. 7 and 8 schematically depict embodiments of a memory structure that includes a plurality of memory cells each including a chalcogenide based memory storage element 23 disposed between a heater electrode 39 and a conductor 33 or 37 that is vertically adjacent a top surface of the heater electrode. As schematically depicted, the chalcogenide based memory storage element 23 can be a chalcogenide via fill or a chalcogenide tubwell. The heater electrode 39 can be a heater via fill or a heater tubwell, as shown.

Each memory cell further includes a control element 25 disposed between a lower surface of the heater electrode 39 and a conductor 33 or 35 that is vertically adjacent the lower surface of the heater electrode 39. The control element 25 can be formed of an oxide of the conductor 33 or 35 that is vertically adjacent the lower surface of the heater electrode 39. Alternatively, the control element 25 can be formed of an oxide that is different from an oxide of the conductor 33 or 35. The control element 25 can also be a portion of an unpatterned oxide layer that can be a deposited oxide layer or a completely oxidized deposited metal layer, for example.

It should be appreciated that the embodiments shown in FIGS. 7 and 8 can be modified to include a thermal conduction reducing conductor between the chalcogenide memory storage element 23 and the conductor 33 or 37.

The memory cells of FIGS. 7 and 8 can be implemented in stacked layers for example wherein a conductor 33 that is vertically adjacent a top surface of a heater electrode 39 is vertically adjacent the lower surface of a heater electrode that is in an adjacent layer.

By way of illustrative example, the conductor 33 can be a memory row selection line while the conductors 35, 37 can be memory column selection lines in a cross-point memory structure.

Figure 9:
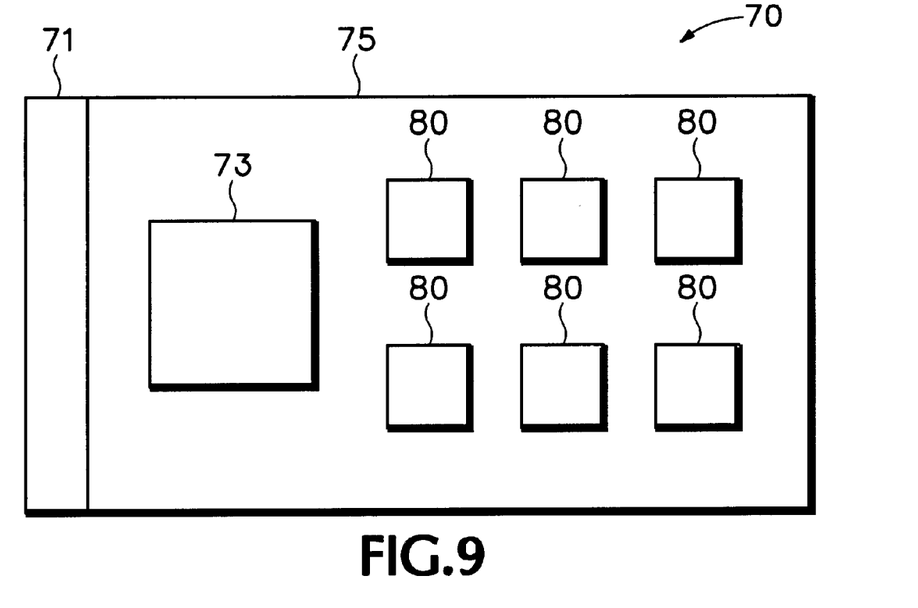
FIG. 9 is a schematic block diagram of an embodiment of a memory carrier that incorporates at least one of the disclosed memory structures.

FIG. 9 is a block diagram of an embodiment of a memory carrier 70 that incorporates at least one embodiment of the invention. The memory carrier represents any of standard or proprietary memory card formats such as PCMCIA, PC card, Smart memory, Memory Stick, digital film, ATA, and compact flash, to name a few. The memory carrier 70 includes a mechanical interface 71 that provides for mechanical and electrical connection with a particular connector for the type of memory carrier implemented. An optional electrical interface 73 makes electrical coupling with the electrical contacts on the mechanical connector 71 and provides for example security, address decoding, voltage translation, write protection, or other typical interface functions with a set of memory ICs 80 that incorporate at least one embodiment of the invention. A carrier 75, for example a printed circuit board or ceramic substrate, typically is used to physically support the memory ICs 80, electrical interface 73, and mechanical interface 71. It will be appreciated by those skilled in the art that some electrical devices, might incorporate the functionality of the electrical interface 73, thereby obviating its need in the memory carrier 70.

Figure 10:
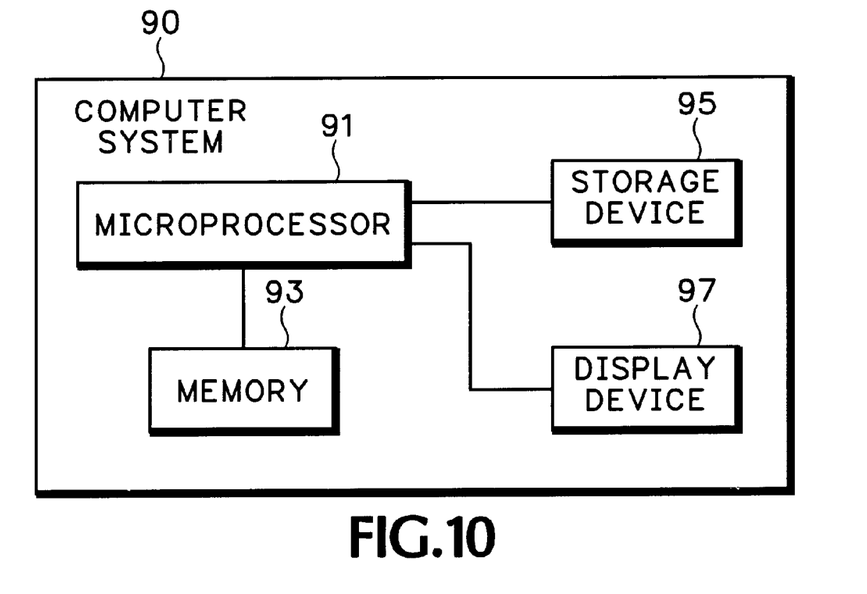
FIG. 10 is a schematic block diagram of an embodiment of an electronic device, such as a computer system, that incorporates at least one of the disclosed memory structures.

FIG. 10 is a block diagram of an embodiment of an electronic device, in this example a computer system 90, that incorporates at least one embodiment of the invention. In particular for a computer system, several different electrical devices as shown may be incorporated into the package. For example, a microprocessor 91 is coupled to a memory circuit 93 used to store computer executable instructions and/or user data. Exemplary memory circuits 93 include BIOS memory, random access memory (RAM), read only memory (ROM), and various levels of internal or external cache memory. The microprocessor 91 is also connected to a storage device 95 such as a hard disk drive, floppy drive, CD/DVD drive, tape drive or other mass storage devices such as those that incorporate semiconductor memory ICs that utilize the invention. The microprocessor 91 can include an internal cache memory that uses the invention. The memory 93 may also include memory ICs that use the invention. The microprocessor is further connected to a display device 97 that can also incorporate memory ICs that utilize the invention. The electronic device can also be configured to accept the memory carrier 70 of FIG. 9.

Figure 11:
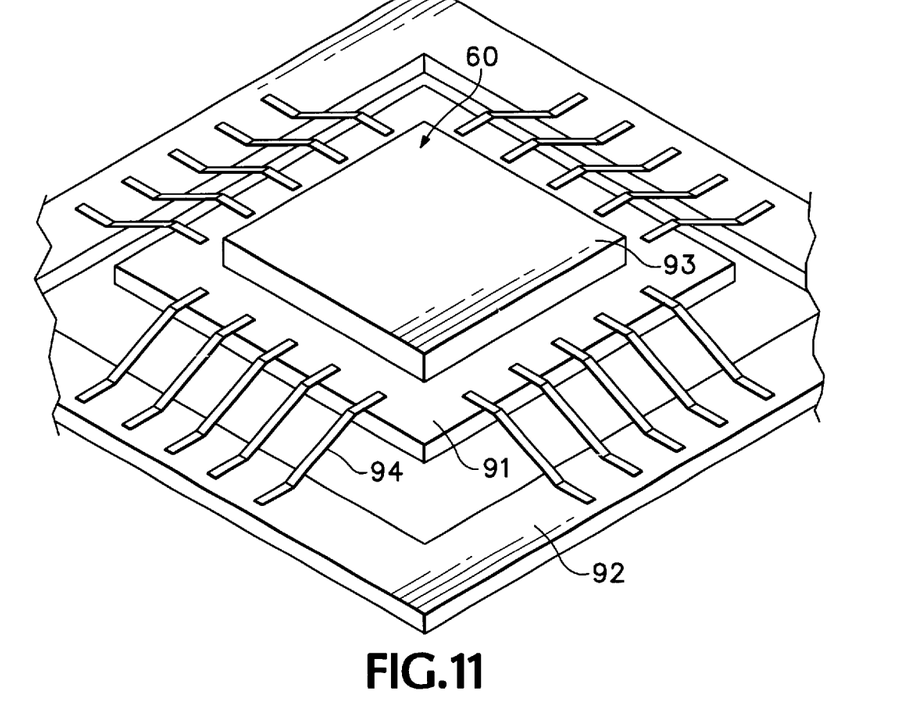
FIG. 11 is a schematic block diagram of an embodiment of an integrated circuit that embeds at least one of the disclosed memory structures.

FIG. 11 schematically depicts an exemplary embodiment of an embedded memory array 60 that integrates the memory 93 which uses the invention, such as level 1 and/or level 2 cache, with the microprocessor 91. The embedded memory array 60 is fabricated on top of the integrated circuit die of the microprocessor 91 which allows for a smaller die area size. The microprocessor 91 is electrically attached to a package 92 by bonding wires 94 or TAB circuit technology, for example. After the microprocessor is attached to the package 92, it is encapsulated (not shown) to provide protection from contaminants and handling. Although the embedded memory array 60 is shown as disposed on a microprocessor integrated circuit, it should be appreciated that any integrated circuit that utilizes memory circuits can be substituted for the microprocessor 91.

The disclosed memory structures can be implemented using semiconductor equipment. For example, the conductors can be formed by deposition of a metal layer followed by patterning by photolithographic masking and etching. Dielectric regions can be formed by deposition of dielectric material, while oxide layers can be formed by deposition of an oxide, deposition of a metal followed by oxidation of the deposited metal, or oxidation of a metal feature. Chemical mechanical polishing (CMP) can be employed to planarize and/or expose desired regions. Also, damascene processes such as dual damascene can be employed. In dual damascene processes, ILD is etched, metal is deposited on the etched ILD, and CMP is performed.

Figure 12:
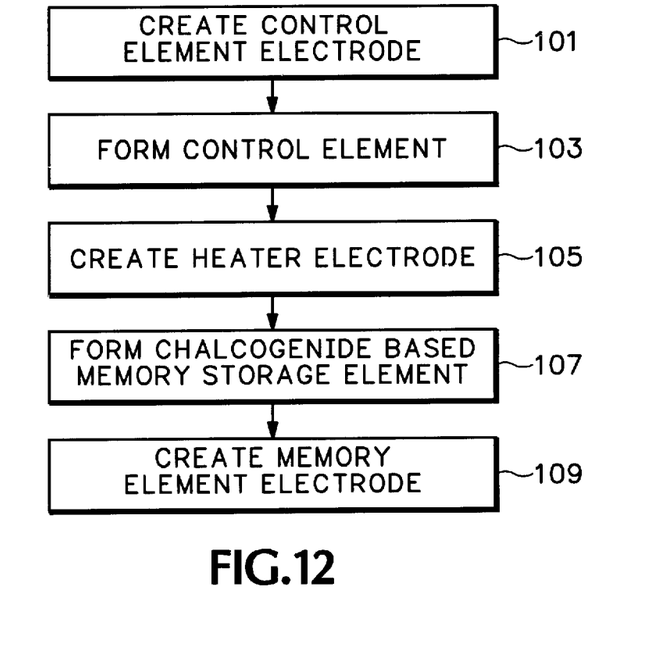
FIG. 12 is a flow diagram of an embodiment of the basic steps that can be used to implement the disclosed memory structures.

Referring now to FIG. 12, the disclosed structures can generally be made as follows. At 101 a control element electrode is created for example by depositing and patterning a metal layer. At 103 a control element is formed on the control element electrode, for example by oxidizing the electrode or forming an unpatterned oxide layer as described above. At 105 a heater electrode is created, for example by depositing and patterning a suitable metal layer. At 107 a chalcogenide based memory storage element is formed in contact with the heater electrode. At 109 a memory element electrode is created. The memory element electrode can include a thermal conduction limiting conductor as shown in FIGS. 5 and 6.

Although the foregoing has been a description and illustration of specific embodiments of the invention, various modifications and changes thereto can be made by persons skilled in the art without departing from the scope and spirit of the invention as defined by the following claims.

What is claimed is:

1. A memory structure comprising:

a control element electrode;

a heater electrode;

a memory element electrode;

a chalcogenide based memory element disposed between said memory element electrode and said heater electrode; and a control element disposed between said heater electrode and said control element electrode.

2. The memory structure of claim 1 wherein said heater electrode comprises tungsten.

3. The memory structure of claim 1 wherein said heater electrode comprises titanium.

4. The memory structure of claim 1 wherein said chalcogenide based memory element comprises germanium telluride.

5. The memory structure of claim 1 wherein said chalcogenide based memory element comprises material selected from the group consisting of GaSb, InSb, InSe, Sb2Te3, Ge2Sb2Te5, InSbTe, SnSb2Te4, InSbGe, AgInSbTe, (GeSn)SbTe, GeSb(SeTe), Te81Ge15Sb2S2 and GeSbTe.

6. The memory structure of claim 1 wherein said control element comprises a tunnel junction device.

7. The memory structure of claim 1 wherein said control element comprises an oxide of said control element electrode.

8. The memory structure of claim 1 wherein said control element comprises a diode.

9. The memory structure of claim 1 wherein said control element is selected from the group consisting of a recrystallized semiconductor, junction field effect transistor, a junction field effect transistor with its gate connected to its source or drain, a four-layer diode, an NPN transistor, and a PNP transistor.

10. An integrated circuit including the memory structure of claim 1.

11. An integrated circuit embedding the memory structure of claim 1.

12. A memory carrier including the memory structure of claim 1.

13. An electronic device configured to receive the memory carrier of claim 12.

14. An electronic device including the memory structure of claim 1.

15. The memory structure of claim 1 wherein:

said heater electrode comprises a heater tubwell having a rim and a base; and said chalcogenide based memory element is disposed on said rim of said heater tubwell.

16. The memory structure of claim 1 wherein:

said heater electrode comprises a heater tubwell having a rim and a base; and said chalcogenide based memory element comprises a portion of a chalcogenide layer adjacent said rim of said heater tubwell.

17. The memory structure of claim 1 wherein:

said heater electrode comprises a heater tubwell having a rim and a base; and said chalcogenide based memory element comprises a chalcogenide tubwell.

18. The memory structure of claim 1 wherein:
said heater electrode comprises a heater tubwell having a rim and a base; and
said chalcogenide based memory element comprises a chalcogenide via fill.

19. The memory structure of claim 1 wherein:
said heater electrode comprises a heater via fill having a top surface; and
said chalcogenide based memory element is disposed on said top surface of said heater via fill.

20. The memory structure of claim 1 wherein:
said heater electrode comprises a heater via fill; and
said chalcogenide based memory element comprises a portion of a chalcogenide layer adjacent said heater via fill.

21. The memory structure of claim 1 wherein:
said heater electrode comprises a heater via fill; and
said chalcogenide based memory element comprises a chalcogenide tubwell.

22. The memory structure of claim 1 wherein:
said heater electrode comprises a heater via fill; and
said chalcogenide based memory element comprises a chalcogenide via fill.

23. The memory structure of claim 1 wherein said memory electrode includes a thermal conduction reducing electrode component.

24. The memory structure of claim 1 wherein said memory electrode includes a thermal conduction reducing conductive via fill and a memory selection conductor.

25. The memory structure of claim 1 wherein said memory electrode includes a thermal conduction reducing conductive tub well and a memory selection conductor.

26. A memory structure comprising:
a control element electrode;
a heater electrode;
a memory element electrode;
a chalcogenide based memory element disposed between said memory element electrode and said heater electrode; and
a control tunnel junction disposed between said heater electrode and said control element electrode.

27. The memory structure of claim 26 wherein said heater electrode comprises tungsten.

28. The memory structure of claim 26 wherein said heater electrode comprises titanium.

29. The memory structure of claim 26 wherein said chalcogenide based memory element comprises germanium telluride.

30. The memory structure of claim 26 wherein said chalcogenide based memory element comprises material selected from the group consisting of GaSb, InSb, InSe, Sb2Te3, Ge2Sb2Te5, InSbTe, SnSb2Te4, InSbGe, AgInSbTe, (GeSn)SbTe, GeSb(SeTe), Te81Ge15Sb2S2 and GeSbTe.

31. A memory structure comprising:
a control element electrode;
a heater electrode comprising material selected from the group consisting of tungsten and titanium;
a memory element electrode;
a chalcogenide based memory element disposed between said memory element electrode and said heater electrode;
said chalcogenide based memory element comprising material selected from the group consisting of GeTe, GaSb, InSb, InSe, Sb2Te3, Ge2Sb2Te5, InSbTe, SnSb2Te4, InSbGe, AgInSbTe, (GeSn)SbTe, GeSb(SeTe), Te81Ge15Sb2S2 and GeSbTe; and
a control element disposed between said heater electrode and said control element electrode.

32. The memory structure of claim 31 wherein said heater electrode comprises a heater tubwell.

33. The memory structure of claim 31 wherein said chalcogenide based memory element comprises a chalcogenide tubwell.

34. The memory structure of claim 31 wherein said memory element electrode includes a thermal conduction reducing conductor.

35. A memory structure comprising:
a control electrode;
a heater electrode;
a memory electrode;
means, disposed between said memory electrode and said heater electrode, for storing a memory state using a chalcogenide based memory element; and
a control element disposed between said heater electrode and said control electrode.

* * * * *